(12) United States Patent
Shih et al.

(10) Patent No.: US 9,048,305 B2
(45) Date of Patent: Jun. 2, 2015

(54) HIGH ELECTRON MOBILITY TRANSISTORS WITH MINIMIZED PERFORMANCE EFFECTS OF MICROCRACKS IN THE CHANNEL LAYERS

(71) Applicants: Ishiang Shih, Brossard (CA); Chunong Qiu, Brossard (CA); Cindy X. Qiu, Brossard (CA); Yi-Chi Shih, Los Angeles, CA (US)

(72) Inventors: Ishiang Shih, Brossard (CA); Chunong Qiu, Brossard (CA); Cindy X. Qiu, Brossard (CA); Yi-Chi Shih, Los Angeles, CA (US)

( * ) Notice: Subject to any disclaimer, the term of this patent is extended or adjusted under 35 U.S.C. 154(b) by 119 days.

(21) Appl. No.: 13/998,210

(22) Filed: Oct. 15, 2013

(65) Prior Publication Data
US 2015/0102387 A1 Apr. 16, 2015

(51) Int. Cl.
*H01L 29/66* (2006.01)
*H01L 29/778* (2006.01)

(52) U.S. Cl.
CPC .................................. *H01L 29/7787* (2013.01)

(58) Field of Classification Search
None
See application file for complete search history.

(56) References Cited

U.S. PATENT DOCUMENTS

| 6,768,137 | B2 * | 7/2004 | Kushibe et al. | 257/103 |
| 2006/0006414 | A1 * | 1/2006 | Germain et al. | 257/192 |

* cited by examiner

*Primary Examiner* — Bilkis Jahan
*Assistant Examiner* — Kevin Quinto

(57) ABSTRACT

In HEMTs based on III-nitrides epitaxial films or GaAs, AlGaAs and InGaAs epitaxial films, unwanted microcracks are often formed in the composite epitaxial layers in the channel region during fabrication and operation. These microcracks are caused by strain or stresses due to lattice mismatch and thermal expansion coefficient differences between materials and substrate's. Those microcracks will bring about an increase in source to drain resistance and lead to performance and reliability degradation of the HEMTs and the MMICs containing them. The present invention provides HEMTs with minimized effects of the unwanted microcracks by aligning the channel region long axis to a certain direction so that the channel region long axis forms a right angle with axis of at least one type of the microcracks.

22 Claims, 7 Drawing Sheets

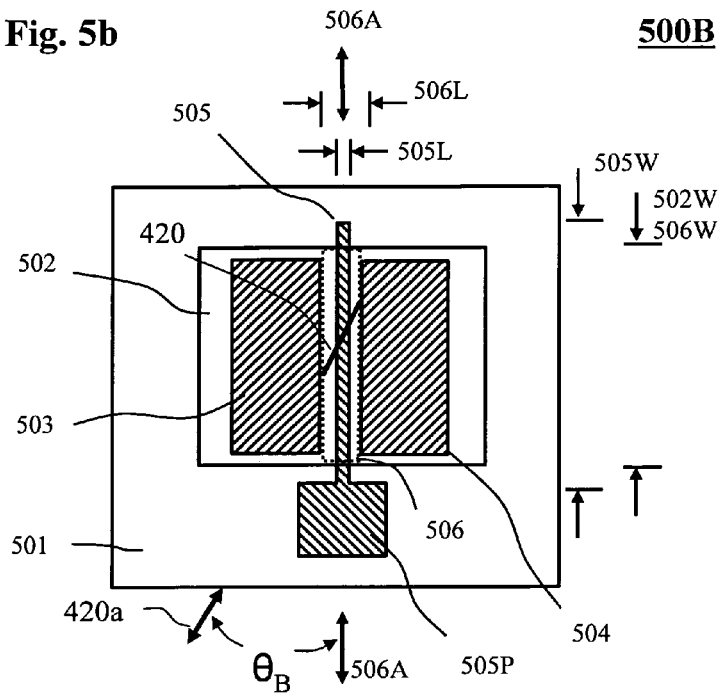
Fig. 5b
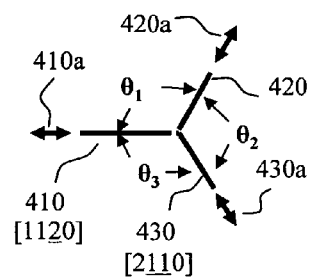
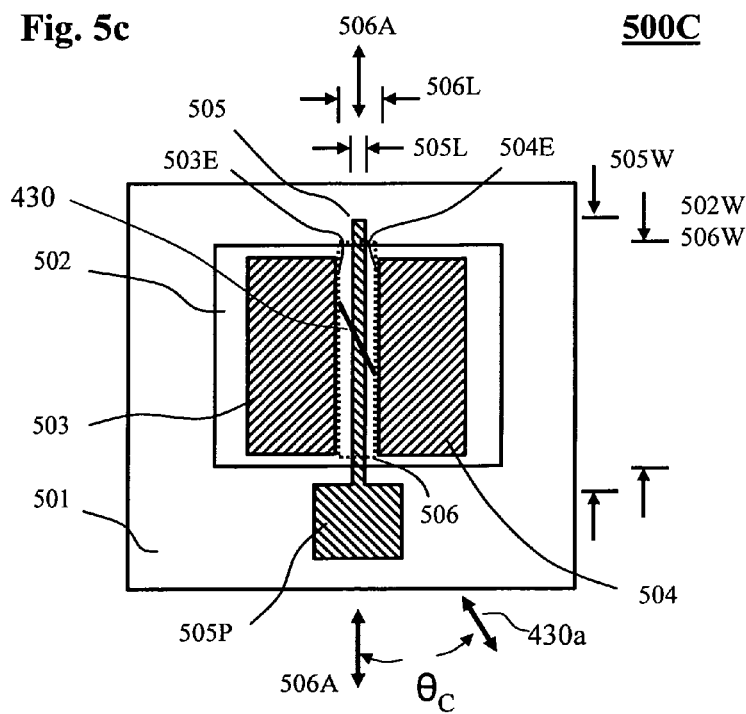
Fig. 5c
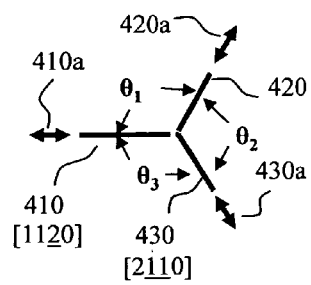

Fig. 5d                                                    500CR
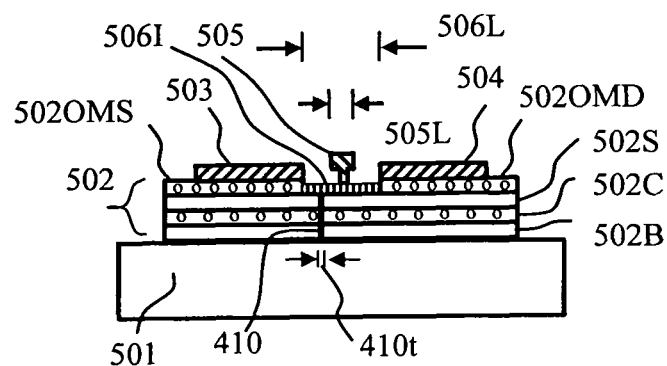
Fig. 5e                                                    505
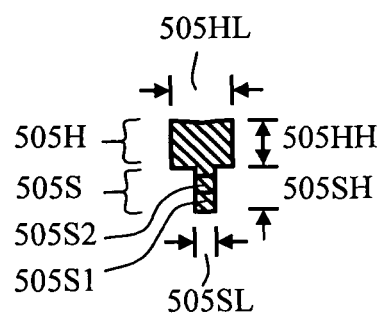

HIGH ELECTRON MOBILITY TRANSISTORS WITH MINIMIZED PERFORMANCE EFFECTS OF MICROCRACKS IN THE CHANNEL LAYERS

FIELD OF INVENTION

The present invention is related to transistor devices and MMICs for power switching and microwave amplification and switching. Specifically, it is related to transistor devices having minimized performance effects of microcracks formed in the channel layers during fabrication and operation.

BACKGROUND OF THE INVENTION

For power switching, devices based on a metal-oxide-semiconductor (MOS) structure, an insulated gate bipolar transistor (IGBT) structure and a lightly doped drain metal-oxide-semiconductor (LDMOS) structure are commonly used. Power devices based on the MOS structure are mainly used in domestic units which are operated at a few hundreds volts. Power devices based on IGBT are for high power switching in applications including AC to DC or DC to AC conversion and are designed to sustain high voltages up to several kilovolts. Power devices based on LDMOS are for intermediate power level applications. Current MOS, LDMOS and IGBT devices are manufactured using silicon technology which has been successful in these applications due to significant research and development in the last six decades. However, the performance of these silicon power devices is still limited mainly due to their limited breakdown electric field.

Recently, a new class of semiconductors based on III-nitrides are being developed, where III represents group three metals: Al, Ga and In. Examples of the new class of semiconductors include AlN, GaN, InN and their alloys such as AlGaN, InGaN and AlInN. Some of these new III-nitrides have exceptional electronic properties compared to crystalline silicon. In addition, energy bandgap values of the III-nitrides, specifically that of GaN, AlGaN and AlN are large compared to silicon and gallium arsenide. Because of the large energy bandgaps, devices fabricated using these III-nitrides semiconductors and their mixtures or alloys have breakdown electric fields substantially greater than that of their counter parts: Si and GaAs. For instance, the breakdown electric field for AlGaN is $3.0 \times 10^6$ V/cm which is about 10 times of that for Si and GaAs, the two most important electronic semiconductors in industry; therefore, the III-nitrides can sustain larger voltages with the same device dimensions or thicknesses. It should also be noted that charge carrier mobilities of the III-nitrides are greater than silicon. Furthermore, the critical temperatures of some of the III-nitrides for stable operation are substantially higher than that of GaAs and Si. As a comparison, the critical junction temperature for stable operation is 250° C. for silicon devices, 400° C. for GaAs devices and it is 600° C. for devices based on GaN, AlGaN and InGaN. Combining high breakdown electric field, high charge carrier mobility and high critical temperature for stable operation of the III-nitride devices, it is evident that these devices and circuits are ideal for high power switching and high frequency millimeter wave circuit applications and it is possible for the III-nitrides to replace some of the high frequency applications currently provided by GaAs technology.

However, due to the difference between the III-nitrides materials and the sapphire or SiC substrates used for these devices, there is often a mismatch in their thermal expansion coefficients and their lattices. These differences in thermal expansion coefficients and lattices will induce strain or stresses in the epitaxial III-nitride thin films and the substrate during cooling or heating stages. These strain or stresses may lead to microcracks in the epitaxial III-nitride layers and the electronic properties of the films may be affected due to the presence of the microcracks. It should be noted that these microcracks are often too small to be unequivocally observed under simple optical microscopes with a low magnification.

Although current III-nitride devices are mainly manufactured on sapphire or SiC substrates, both sapphire and SiC substrates are more difficult or expensive to manufacture due to the nature of the compounds and their high melting points. On the contrary, silicon wafers have been developed in the last six decades and the manufacturing technology is more mature. Hence the substrate cost is lower and the supply more abundant. If high quality III-nitride layers and devices can be developed on Si wafers, then high power and high frequency devices may be achieved with reduced manufacturing cost. While vigorous recent efforts have been made on research and development of III-nitride epitaxial growth on silicon wafer and device fabrication, there are still obstacles to be overcome. One of the obstacles is related to the present invention and is resulted from lattice mismatch and thermal expansion coefficient difference between materials. During deposition of III-nitrides, the substrate temperatures are often in the order of 1000° C. After the deposition and during cooling, significant strain or stresses can be induced in the deposited III-nitride epitaxial layers and the substrates. Since the epitaxial layers have much smaller thickness compared to the substrates, microcracks will form in the deposited III-nitride films. The microcracks can degrade the electronic performance and reliability of the fabricated devices and circuits. The present invention provides a structure and a method of manufacturing to minimize the degradation on performance and reliability caused by microcracks in the epitaxial III-nitride films.

SUMMARY OF THE INVENTION

One objective of the invention is to provide a transistor structure to have minimized effects of one type of microcracks on the performance and reliability of the devices. One other objective of the invention is to provide a HEMT structure to minimize the effects of three types of microcracks on the performance and reliability of the devices.

BRIEF DESCRIPTION OF THE SEVERAL VIEWS OF THE DRAWING

FIG. 1a is a simplified top view of an ideal HEMT 100 and FIG. 1b shows a schematic cross-sectional view of the HEMT 100 taken along line A-A' in FIG. 1a.

FIG. 5b shows that under the condition $\theta_A=90°$, when a second microcrack (420) is present, the second microcrack long axis (420a) will make a second angle $\theta_B=30°$ with the channel region long axis (506A) to minimize the effects of the second microcrack (420).

FIG. 5c shows that if $\theta_A=90°$, when a third microcrack (430) is present, the third microcrack long axis (430a) will make a third angle $\theta_C=30°$ with the channel region long axis (506A) to minimize the effects of the third microcrack (430).

FIG. 5d is a cross-section taken along a line, in FIG. 5a, which is perpendicular to the channel region long axis (506A) and through the first type microcrack (410), showing composite channel layers and a gate insulator layer (506I) to reduce leakage between the gate and the source and between the gate and the drain.

FIG. 5e is an enlarged cross-section of gate (505), showing a stem portion (505S) and a head portion (505H).

DETAIL DESCRIPTION OF THE INVENTION

Figure 1A:
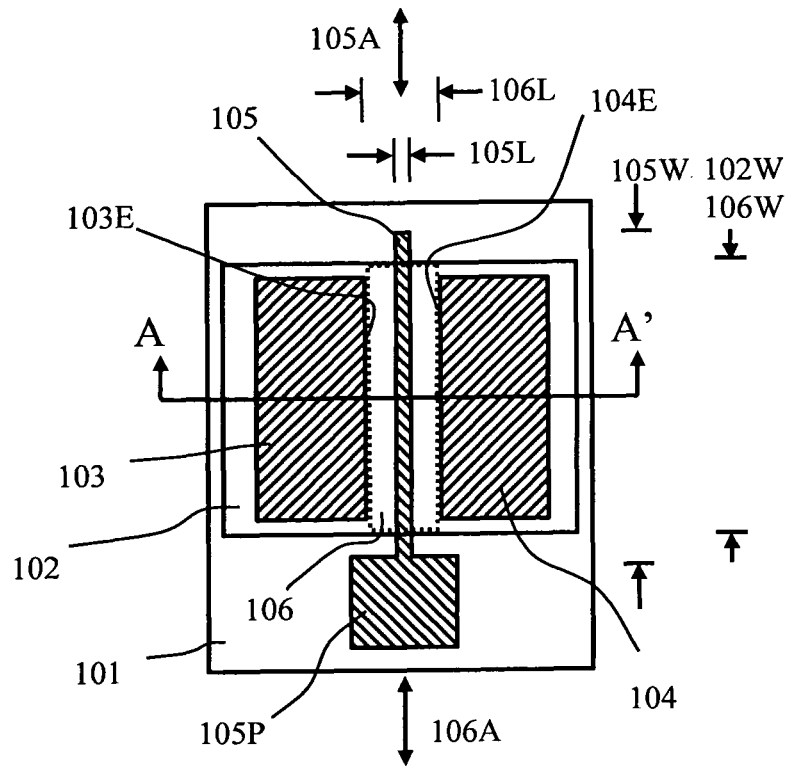

Occurrence of Microcracks:

The devices considered in this invention are based on III-nitrides films deposited on substrates such as silicon, sapphire and silicon carbide. Take Si wafers as an example, the deposition of the III-nitride films may be made on (111) plane or (100) plane. During the cooling period after the deposition, tensile stresses are induced in the deposited III-nitride epitaxial layers. For example, in AlGaN—GaN—Si with undoped AlGaN and undoped GaN layers, the tensile stress induced in the AlGaN layer leads to charge polarization in the AlGaN layer. Due to the charge polarization, positive polarization charges are induced in the AlGaN near the GaN layer whereas negative polarization charges are induced on or near the top surface of the AlGaN layer. The positive polarization charges induce negative mobile charges (free carriers) of equal amount on the top of the GaN layer, forming a mobile charge sheet for a conduction channel of the transistor to be formed. The transistor to be formed will have a channel, a source, a drain and a gate with a gate voltage applied to the gate for channel charge modulation and the transistor device is called a high electron mobility transistor (HEMT). Because the negative mobile charges are induced in the undoped GaN layer, impurity scattering is a minimum. Hence, the mobility of the induced negative charges is high. To further enhance the performance, impurity doping may be introduced into AlGaN layer to donate mobile electrons to the adjacent GaN layer. It is thus clear that in the III-nitride HEMTs, stresses induced in the layers are required for the transistor to operate.

Although such devices seem to be ideal in term of carrier mobility and breakdown electric field, there is an unwanted effect due to lattice mismatch and difference in thermal expansion coefficients between the silicon substrate and the deposited III-nitride films, InGaN, AlGaN and GaN in this case. The thermal expansion coefficients of GaN, AlGaN and InGaN are greater than that of silicon (see table 1). Therefore, during the period of cooling to room temperature after the deposition, there are substantial tensile stresses in the deposited InGaN, AlGaN and GaN layers. These tensile stresses can lead to formation of microcracks in InGaN, AlGaN and GaN layers after the deposition, during the subsequent device fabrication and even during the operation. It is noted that the InGaN may be replaced by a doped GaN.

TABLE 1

Thermal expansion coefficients of materials related to HEMTs

| Material | Thermal expansion coefficient ($10^{-6}$/K) |
|---|---|
| AlN | 5.3 |
| GaN | 5.5 |
| InN | 3.8 |
| GaAs | 6.8 |
| $Al_{0.2}Ga_{0.8}As$ | 5.6 |
| $In_{0.2}Ga_{0.8}As$ | 5.6 |
| Si | 3.0 |
| SiC | 2.8 |
| Sapphire | 5-6.6 |

In addition to the III-nitride epitaxial layers, strain or stresses are also present in HEMTs based on another material system of GaAs, AlGaAs, InGaAs with certain microcrack occurrence due to the strain or stresses. Therefore, the embodiments according to the present invention may well be suited to improve the performance and reliability of such devices and MMICs based on GaAs, AlGaAs, InGaAs which may be epitaxially grown on substrates of GaAs, Si and InP. For HEMTs, a composite epitaxial layer usually consists of a buffer layer which may include alternate GaAs and InGaAs thin layers; an undoped small gap InGaAs channel layer for charge carriers to flow from source to drain; an AlGaAs Schottky layer which has a large energy bandgap and is selectively heavily doped to provide free charge carriers to the InGaAs channel layer; a GaAs ledge layer and a highly doped InGaAs ohmic contact layer. Mobility of electrons in undoped InGaAs is as high as 10,000 $cm^2$/V-sec at room temperature so that devices with high switching speed can be built for high speed circuits. The deposition of the composite epitaxial layer may be made on monocrystalline GaAs, Si and InP substrates.

During the deposition, differences in lattice constants between adjacent epitaxial layers will lead to strain or stresses. After the deposition and during cooling, more strain or stresses will be induced in the composite epitaxial layer and in the substrate due to differences in thermal expansion coefficients between adjacent epitaxial layers and between the composite epitaxial layer and the substrate. As shown in Table 1, the thermal expansion coefficients of GaAs, InGaAs and AlGaAs are also greater than that of Si. Due to these strain and stresses, unwanted microcracks may be induced in the channel regions of HEMTs, leading to performance and reliability degradation of the HEMTs and MMICs containing them. Therefore, the device structures and methods according to this invention may as well be applied to HEMTs based on GaAs, InGaAs and AlGaAs.

Figure 1B:
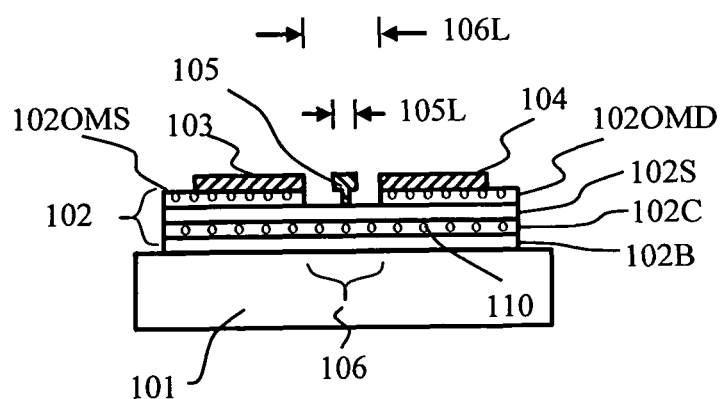

The unwanted microcracks and defects can have detrimental effects to active devices such as HEMTs in a switching circuit or MMIC when these microcracks and defects are within or close to the active channel. In FIG. 1a, a top view of an ideal HEMT (100) is shown. It has a silicon substrate (101), a composite epitaxial layer region (102) having an epitaxial layer region width (102W). This composite epitaxial layer is InGaN—AlGaN—GaN or GaN—AlGaN—GaN in this example. HEMT (100) also comprises a source (103), a drain (104) and a gate (105) with a gate pad (105P), the gate has a gate length (105L), a gate width (105W), the source (103) has a first source edge (103E) facing the gate and the drain (104) has a first drain edge (104E) facing the gate. Between the source and the drain, the area of the composite epitaxial layer region (102) defines a channel region (106) having a channel region length (106L), a channel region width (106W) which is substantially the same as the epitaxial layer region width (102W). The channel region (106) has a channel region long axis (106A) which is substantially parallel to the first source edge (103E) or the first drain edge (104E), whereas the gate has a gate long axis (105A) which is substantially parallel to the channel region long axis (106A). Referring now to FIG. 1b which shows a cross-sectional view (100CR) of HEMT (100) taken along the line A-A' in FIG. 1a. Here, the composite epitaxial layer region (102) is formed by the epitaxial deposition on the silicon substrate (101) and by etching. It consists of at least four sub-layers: an epitaxial buffer layer (102B) to ensure adhesion and lattice relaxing; a conductive channel layer (102C); a Schottky barrier layer (102S); a source ohmic layer (102OMS) and a drain ohmic layer (102OMD). Materials for the buffer layer (102B) may be AlN—AlGaN multiple layers and that for the conductive channel layer (102C) may be GaN or InGaN. The Schottky barrier layer (102S) may be made of AlGaN and the source ohmic layer (102OMS) and drain ohmic layer (102OMD) may be made of heavily doped GaN or InGaN. Alternatively, materials for the buffer layer (102B) may be AlAs—AlGaAs multiple layers and that for the conductive channel layer (102C) may be GaAs or InGaAs. The Schottky barrier layer (102S) may be made of AlGaAs whereas the source ohmic layer (102OMS) and drain ohmic layer (102OMD) may be made of heavily doped GaAs or InGaAs.

As shown in FIG. 1b, a high density of charge carriers or electrons (indicated by circles) are induced in the source ohmic layer and the drain ohmic layer by impurity doping to facilitate ohmic contacts to the source (103) and the drain (104). The source (103) and the drain (104) are metal layers deposited to make ohmic contact to the source ohmic layer and the drain ohmic layer. In the conductive channel layer (102C), there are charge carriers or electrons (110) (shown as circles) with a density which is controlled during the epitaxial growth of the composite (InGaN—AlGaN—GaN) epitaxial layer (102) so that appropriate stresses will be induced to allow a sheet resistance of the conductive channel layer in the order of 100-200 ohm per square or less. For a HEMT with a ratio of a channel region width (106W) to a channel region length (106L) of 100, the ON state resistance of the channel region (106) between the source and the drain is equal to 1 ohm. This 1 ohm resistance can be neglected for certain switching applications.

When a voltage is applied between said gate (105) and said source (103), majority of the charge carriers or electrons are expelled from the conductive channel layer (102C) immediately below the gate (105), caused by an electric fields created in the Schottky barrier layer (102S) immediately below said gate by the applied voltage. The expelling leads to depletion of charge carriers or electrons in the conductive channel layer (102C) immediately below gate (105), increasing its resistivity by several orders of magnitude. The HEMT (100) is now in an OFF state where resistance in the channel region between the drain (104) and the source (103) increases by several orders of magnitude from the original ON resistance value of 1 ohm. The HEMT in the above description is an ideal device without being affected by any unwanted microcracks and acts as an electronic switch.

When intermediate voltages are applied between the gate and the source, intermediate amounts of charge carriers or electrons will remain so that the resistance between the drain and the source will have intermediate values. When such voltages are applied, intermediate currents will be allowed to flow from the drain to the source. With the above behaviour, the HEMT acts as an electronic amplifier for alternating currents or signals, which may vary at microwave or millimeter wave frequencies. In order to obtain good device performance for both switching and signal amplification, the conductive channel in ON state must have continuous distribution of charge carriers or electrons.

It should be noted that in FIG. 1b, the representation of epitaxial buffer layer (102B), conductive channel layer (102C), Schottky barrier layer (102S), source ohmic layer (102OMS) and drain ohmic layer (102OMD) is only for illustration purpose. In actual manufacturing, thicknesses of the source ohmic layer, the drain ohmic layer and the Schottky barrier layer may be in the order of tens of nanometers which are much smaller compared to the conductive channel layer (102C) and the epitaxial buffer layer (102B) which may vary from 500 nm to 1,500 nm or more. For a HEMT based on InGaAs, the thickness of conductive channel layer (102C) is in the order of tens of nanometers.

In the description of operations for the ideal HEMT (100) shown in FIGS. 1a and 1b, it is assumed that no unwanted microcracks are formed in or near the conductive channel layer. In reality, microcracks can form after the epitaxial deposition and in subsequent cooling period. They can also form during device fabrication and during operations. During device or circuit fabrication, there is frequent increase or decrease of substrate temperatures which can induce strain and stresses. During ON state operation, a large current is allowed to flow through the channel region of a HEMT and the temperature of the epitaxial layers is high. When in OFF state, no current is allowed to flow and the temperature of the epitaxial layers is low. Due to continuous On/Off switching of the devices, there is a continuous increase and decrease of temperatures, hence a continuous stressing of the channel epitaxial layers. Due to the thermal stressing in the device operation, some microcracks may be generated in the composite epitaxial layers to affect the performance of HEMTs.

Figure 2A:
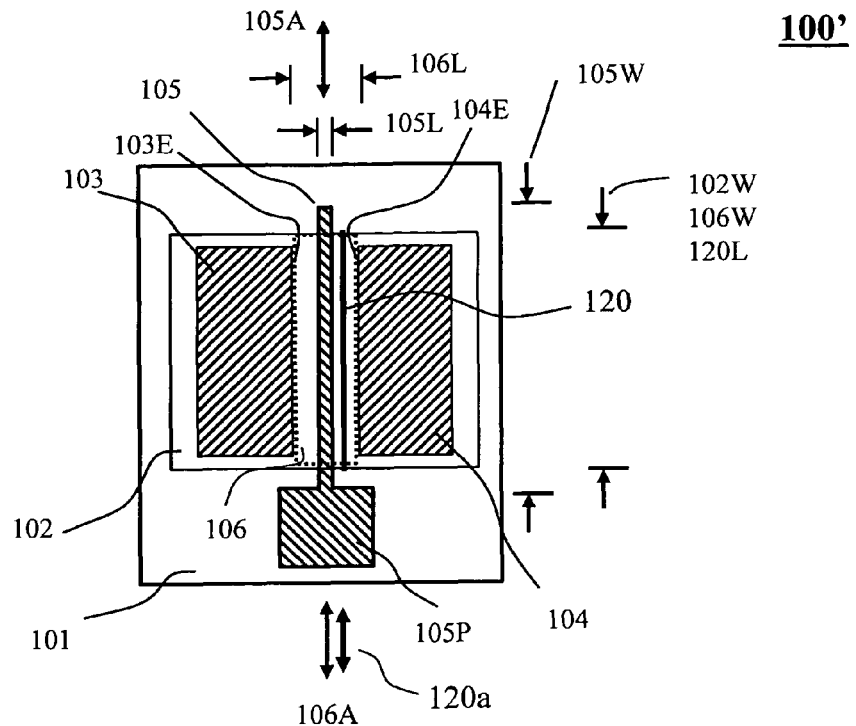
FIG. 2a shows a top view of a HEMT 100' with a first microcrack (120) in the channel region and FIG. 2b a top view of a HEMT 100" with a second microcrack (130) in the channel region.

The Effects of Microcracks:

To illustrate the effects of microcracks, FIG. 2a shows a first microcrack (120) presented in the channel region (106) of a HEMT (100') with a first microcrack length (120L) and a first microcrack long axis (120a) substantially parallel to the channel region long axis (106A), said first microcrack length (120L) is equal or greater than the epitaxial layer region width (102W). Due to high resistance nature of the first microcrack (120), the total resistance between the drain (104) and the source (103) will increase from the resistance value without the presence of any microcracks. This increase in resistance between the drain and the source can be several orders of magnitude. Under such conditions, essentially no current will be allowed to flow when a voltage is applied between the drain and the source except a leakage current. Therefore, the HEMT (100') will not be functioning at all either as a switch or an amplifier. From the above comments, it is clear that the presence of microcracks or defects with a length substantially equal to the channel region width of a HEMT is quite detrimental to the performance of the device and the modules or MMICs incorporating this HEMT.

Figure 2B:
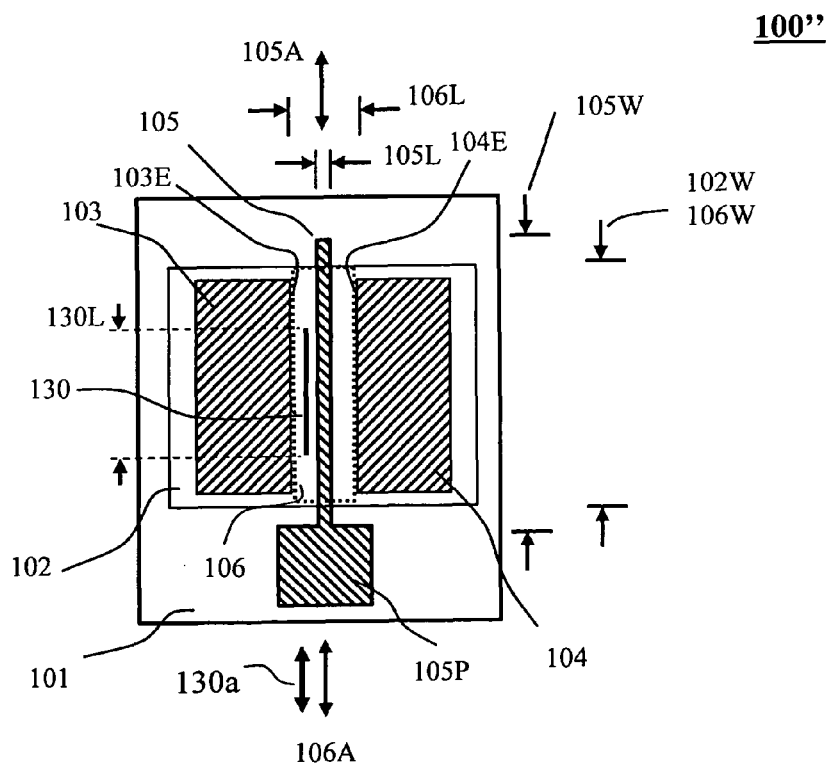
FIG. 2c is a schematic diagram showing one type of microcracks which may be induced in the composite epitaxial layers, with long axes of the microcracks parallel to each other.

As shown in FIG. 2b, when a second microcrack (130) is present in the channel region (106) with a second microcrack long axis (130a) substantially parallel to channel region long axis (106A) having a smaller second microcrack length (130L) which is equal to half of the channel region width (106W), the full current still cannot flow from the drain to the source through the channel region portion where the second microcrack (130) is located. The only currents allowed to flow will be the ones through the two outer channel regions, to the top and the bottom of the microcrack. Therefore, when a constant voltage is applied between the drain and the source, only about 50% of the current will be allowed to flow compared to a HEMT without the second microcrack (130). Under this condition, the performance of the HEMT (100") will be greatly affected.

Due to the lattice mismatch and the thermal expansion coefficients differences between materials, strong stresses can be generated. These stresses can then induce microcracks or defects in the composite epitaxial layers such as GaN—AlGaN—GaN, InGaN—AlGaN—GaN, InGaAs—AlGaAs—InGaAs which will affect the electronic performance of the HEMTs. When one or more of the unwanted microcracks or defects are present in the channel region, the resistance between the drain and the source when the device is in an ON state may be significantly altered and can be 10 times or even more than 1,000 times of the resistance value of an ideal HEMT with no microcracks present in the channel region.

Figure 2C:
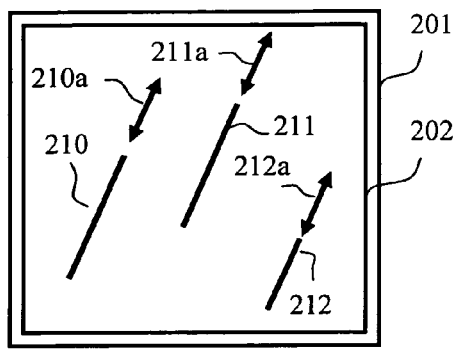

Microcracks showing different properties may form in the composite epitaxial layers with different characteristics. As shown in FIG. 2C, for the III-nitrides epitaxial layers (202) deposited on a substrate (201), it is possible that certain microcracks (210, 211, and 212) may form on the composite epitaxial layers so that long axes (210a, 211a and 212a) of all microcracks are substantially parallel to each other. The long axes of the microcracks are aligned to specific orientation or direction of the III-nitride crystalline layers (202) and hence the specific orientation or direction of the substrate (201). The effects of the above microcracks with long axes aligned in one direction may have severe detrimental effects on HEMTs when present in the channel region, to degrade the ON/OFF ratio or amplification capability.

Figure 3A:
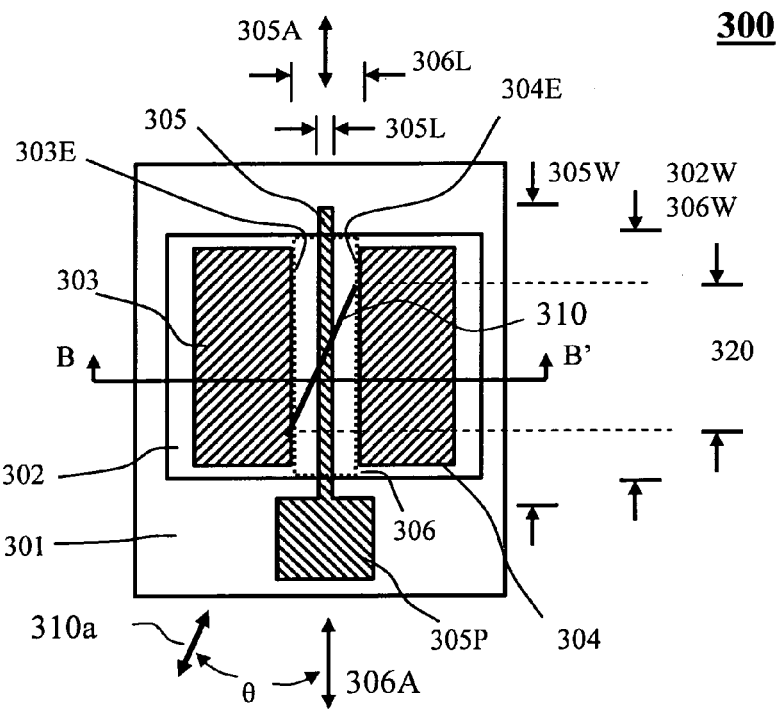
FIG. 3a is a top view of a HEMT (300) with a microcrack (310) showing the channel portion (320) which prohibits a portion of drain current from flowing.

Minimize Effects of Microcracks in One Direction:

According to the present invention, as shown in FIG. 3a, a high electron mobility transistor (HEMT, 300) for power switching or millimeter wave circuit application with minimized performance effects of unwanted microcracks is provided. It comprises a substrate (301); a composite epitaxial layers region (302) having an epitaxial layer region width (302W); a source (303); a drain (304) and; a gate (305) having a gate length (305L), a gate width (305W), a gate long axis (305A) and a gate pad (305P). A first source edge (303E) of the source and a first drain edge (304E) of the drain defines a channel region (306) with a channel region long axis (306A), a channel region length (306L) and a channel region width (306W) which is substantially the same as the epitaxial layer region width (302W). Resistance between the drain (304) and the source (303) is regulated by a voltage applied between the gate (305) and the source (303). A microcrack (310) with a microcrack long axis (310a) is present in the channel region (306). In order to minimize the effects of the microcrack (310) on unwanted resistance increase between the source and the drain, the channel region long axis (306A) is aligned to be substantially away from the microcrack long axis (310a) and the two makes a microcrack long axis angle (θ) of 90 degrees. If the microcrack long axis angle (θ) is substantially different from 90 degrees, see FIG. 3a, when a given voltage is applied between the drain and the source, the current will not be allowed to flow through a channel region portion (320) from the drain (304) to the source (303) so that the total drain to source current will decrease. It should be pointed out that ratio of channel region width (306W) to channel region length (306L) for a typical power HEMT may be 100 or greater. Take a channel region width to length ratio of 100 as an example, when θ is 30 degrees, the channel region portion (320) where the drain to source current is blocked will be 1.73 times of the channel region length (306L) and hence it will be 1.73/100 (or 1.73%) of the channel region width (306W, which is 100 times of the channel region length (306L)).

Figure 3B:
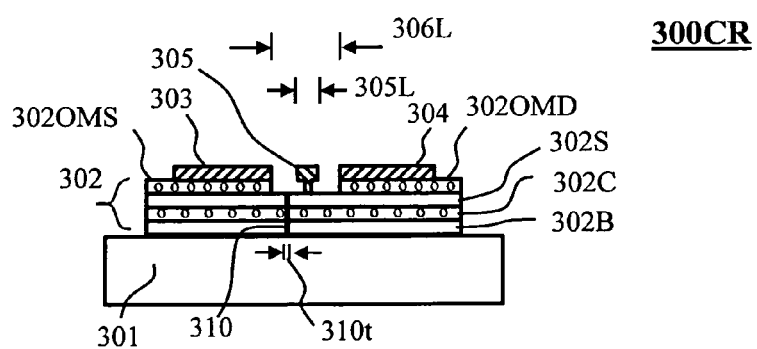
FIG. 3b depicts a cross-section of the HEMT (300) taken along line B-B' showing the composite epitaxial layers and the microcrack (310).

To explain the effects of the presence of a microcrack, a cross-sectional view (300CR) taken along line B-B' of HEMT (300) is shown in FIG. 3b. It comprises a substrate (301); a composite epitaxial layer (302); a source ohmic layer (302OMS); a drain ohmic layer (302OMD); a source contact (303); a drain contact (304) and a gate (305). The composite epitaxial layer (302) consists of a buffer layer (302B), a conductive channel layer (302C) and a Schottky barrier layer (302S). Under normal conditions without the presence of a microcrack, charge carriers will flow from the source contact (303) into the conductive channel layer (302C) in the source side, through the conductive channel layer and reach the conductive channel layer in the drain side and eventually into the drain contact (304) of the HEMT (300).

Materials for the buffer layer (302B) may be AlN—AlGaN multiple layers or GaAs—InGaAs multiple layers, that for the conductive channel layer (302C) may be GaN, InGaN, InGaAs or GaAs. Materials for the Schottky barrier layer (302S) may be AlGaN, AlGaAs whereas that for the source ohmic layer (302OMS) and the drain ohmic layer (302OMD) may be GaN, InGaN, GaAs or InGaAs with high doping levels. It should be noted that for high power or high voltage applications, more than one gate lines may be adopted in a HEMT. These gate lines are connected together and in parallel electrically. However, in order to simplify the description and explanation, only one single gate line will be shown in the present description and figures. It is thus understood that the present invention will be valid for HEMT devices having more than one gate line.

When a microcrack (310) is present with a microcrack gap (310t), the conductive channel become completely or partially discontinuous electrically due to a potential barrier formed in the microcrack to impede the flow of the electrons (shown as circles) through the conductive channel layer (302C). This leads to a large increase in the resistance between the drain (304) and the source (303) which could be as high as about $10^3$ times or even more than $10^6$ times of the ideal values without any microcracks. With this increase in the drain to source resistance due to the presence of the microcrack (310), the switching performance and amplification capability of the HEMT (300) will degrade.

Figure 3C:
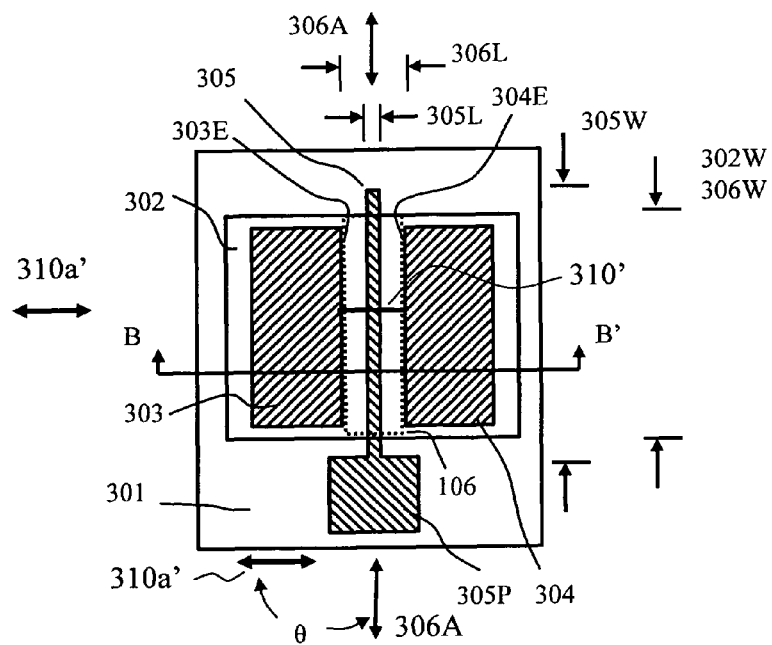
FIG. 3c shows a top view of a HEMT (300') with a microcrack (310'), the channel region of the HEMT (300') is aligned in such a manner so that an angle θ between the microcrack long axis (310a') and the channel region long axis (306A) is 90° to eliminate the influence of the microcrack (310') on the drain current.

According to one embodiment of the present invention, in order to minimize the unwanted increase in resistance between drain and source of HEMT (300'), as shown in FIG. 3c, microcrack long axis angle (θ) between the channel region long axis (306A) and the microcrack long axis (310a') of a microcrack (310') is controlled to be close to 90 degrees during the device and circuit fabrication. Although it is unavoidable to have certain deviation from 90 degrees for microcrack long axis angle (θ) in manufacturing, such a deviation should be kept to be less than 10 degrees and more preferably less than 2 degrees. When the deviation is 2 degrees, for each unwanted microcrack generated or present, the portion of channel affected by the unwanted microcracks and with high resistance can be reduced to be less than 0.1% of the channel region width of the HEMT.

For a HEMT with a ratio of channel region width (306W) to channel region length (306L) of 100 (306W/306L=100), the channel region portion (320) where flow of charge carriers will be affected by the presence of the single microcrack (310') is equal to 306L/tan θ (Here 306L is the channel region length). When the deviation of microcrack long axis angle is 10 degrees (Δθ=θ−90°=±10°), the channel region portion (320) is 0.176 times 306L or 0.00176 times 306W. Therefore, the maximum increase of resistance between the drain and the source with the presence of a single microcrack will be less than 0.2%. For HEMTs with a better control of alignment so that deviation Δθ=θ−90°=±2 degrees, the unwanted increase of drain to source resistance will be less than 0.04%.

According to the present invention, once the channel region long axis (306A) is aligned to be substantially perpendicular to the microcrack long axis of one microcrack, long axes of all other microcracks parallel to that microcrack will form a right angle with the channel region long axis, therefore the effects of all microcracks in the same direction will be minimized.

Due to continuous On/Off switching of the devices, there is a continuous increase and decrease of device temperatures, hence a continuous stressing of the channel epitaxial layers caused by thermal expansion coefficient differences. As a result of the thermal stressing during the operation, some microcracks may be generated in the composite epitaxial layers to affect the performance of HEMTs. Since the channel region long axis (306A) is aligned to have a 90° angle with the microcrack long axis (310a') of a microcrack (310') pre-existing in the channel region, when new microcracks occur in the channel region during operation, those having the same direction as that of the pre-existing microcrack (310') will have minimized negative effects on the performance of the HEMT.

According to this invention, the HEMT devices with a controlled microcrack long axis angle (θ) to be substantially 90 degrees (with a deviation ≤2°) will greatly reduce the unwanted source to drain resistance increase caused by a microcrack in the channel region to well below 0.1%. When incorporated in millimeter wave integrated circuits for the amplification and processing of microwave signals or into power modules for switching and regulation of high electrical power the performance of HEMT will be stable and reliable.

Figure 3D:
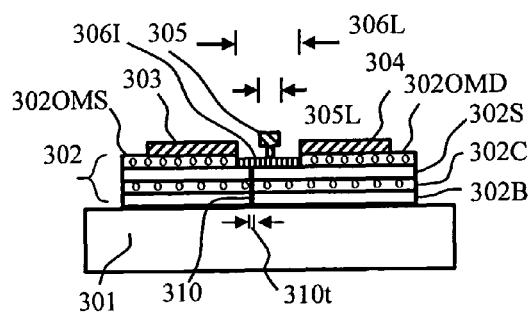
FIG. 3d is a cross-sectional view of HEMT (300') taken along line B-B' showing a gate insulator layer (306I) to reduce leakage between the gate and the source and between the gate and the drain.

According to another embodiment of this invention, a thin gate dielectric layer (306I) is inserted between the Schottky barrier layer (302S) and the gate (305) as shown in cross-sectional view (300'CR) in FIG. 3d, so that unwanted leakage current between the gate (305) and the source (303), leakage current between the gate and the drain (304) are minimized. In this manner, the potential barrier height between the gate and the Schottky barrier layer is increased so that unwanted leakage is reduced. Material of the thin gate dielectric layer (306I) is selected from a group including silicon nitride, silicon oxide, silicon oxide nitride, magnesium oxide, hafnium oxide, aluminum oxide and their mixtures.

Figure 3E:
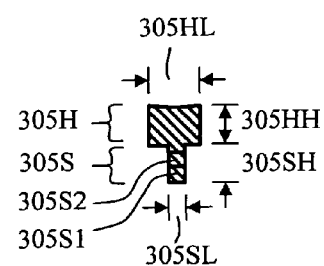
FIG. 3e is a cross-section of the gate with a gate stem portion (305S) and a head portion (305H).

According to still another embodiment of the present invention, as shown in FIG. 3e, the gate (305) has a stem portion (305S) with a stem height (305SH) and a stem length (305SL); a head portion (305H) with a head height (305HH) and a head length (305HL) so that unwanted capacitance associated with the gate is reduced and the distance for charge carriers to travel from the source to the drain is short, to facilitate high frequency operation of the HEMT (300'). To achieve high operation frequencies, the stem length (305SL) is selected to be less than 1 μm whereas the stem height (305HH) is no less than 0.2 μm. Cross-sectional area of the head portion is substantially greater than that of the stem portion to reduce series resistance of the gate (305). The stem portion has a first stem gate metal (305S1) and a second stem gate metal (305S2). Materials for the first stem gate metal are selected from a first material group including Ni, Ti, Ta, W, Pt and their alloys to ensure a rectifying Schottky contact with the epitaxial layers, whereas materials for the second stem gate metal are selected from a second material group of Ni, Ti, Ta, W, Al, Au, Cu and their alloys for good adhesion. The head portion (305H) of the gate is made of metals selected from a group of Ti, W, Au, Cu, Al and their alloys. Materials for the drain contact and the source contact can be selected from a combination of metals such as Ti, Ni, W, Pt, Al, Au, Cu and their alloys as long as the first metal contacting the composite epitaxial layers can make a low contact resistance.

In order to improve the thermal stability of the present HEMT, a layer of passivation material such as silicon nitride, silicon oxide, silicon oxinitride, magnesium oxide, hafnium oxide, aluminum oxide and their mixtures is deposited. As the technology of passivation for transistor devices is not the scope of this invention, more description will not be given.

According to this invention, the HEMT device with controlled channel region long axis with respect to the long axis of the microcracks to minimize unwanted source to drain resistance increase caused by the microcracks may well be incorporated in a millimeter wave integrated circuits for amplification and processing of microwave signals and be incorporated into power modules for switching and regulation of high electrical power.

As stated before, the substrate may be made using materials such as silicon, silicon carbide and sapphire as long as their crystalline quality is suitable for epitaxial growth of the III-nitride layers. The materials for the III-nitride layers may include MN, GaN, InN, AlGaN, InGaN, AlInN and their alloys and the materials for III-arsenide layers may include AlAs, GaAs, InAs, AlGaAs and InGaAs.

Figure 4:
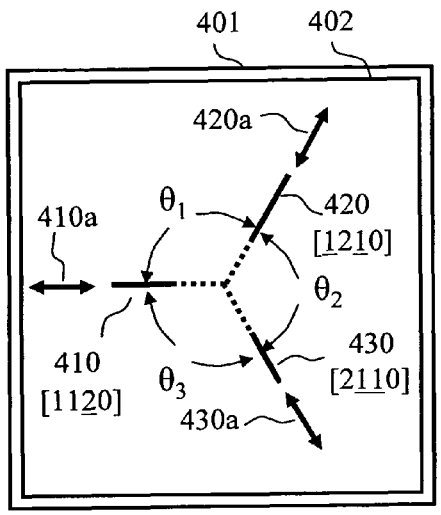
FIG. 4 is a schematic diagram showing three types of microcracks (410, 420 and 430) with long axes pointing in three directions. These microcracks may be induced in composite epitaxial layers (402) of III-nitrides such as InGaN—AlGaN—GaN.

Minimize Effects of Three Possible Microcracks in Epitaxial Layers:

In the channel region of a HEMT device, microcracks with long axes pointing in different directions might be formed on the same composite epitaxial layers. For example, as depicted in FIG. 4 when composite epitaxial layers (402) of III-nitrides such as InGaN—AlGaN—GaN are deposited on (111) oriented silicon substrate (401), three types or groups of microcracks may form due to the lattice mismatch and thermal expansion coefficients difference between the composite epitaxial layers and (111) oriented silicon substrate: a first microcrack (410) has a first microcrack long axis (410a) which is pointing along the [11$\underline{2}$0] direction of the composite epitaxial layers; a second microcrack (420) has a second microcrack long axis (420a) which is pointing along the [$\underline{1}$2$\underline{1}$0] direction of the composite epitaxial layers and a third microcrack (430) has a third microcrack long axis (430a) which is pointing along the [2$\underline{11}$0] direction of the composite epitaxial layers. The angle between the first microcrack long axis (410a) and the second microcrack long axis (420a) is given by $\theta_1$. The angle between the second microcrack long axis (420a) and the third microcrack long axis (430a) is given by $\theta_2$ and that between (410a) and (430a) is given by $\theta_3$. Although all three angles ($\theta_1$, $\theta_2$, $\theta_3$) is 120 degrees, the density or extend of occurrence of the above mentioned three types of microcracks may not be exactly the same. These three types of microcracks may form in relatively arbitrary fashion in terms of location on the composite epitaxial layers. It is clear that for GaN or AlGaN (0001) epitaxial films on Si (111) substrate, there are 3 equivalent primary GaN crack directions along [11$\bar{2}$0], [$\bar{1}$2$\bar{1}$0] and [2$\bar{1}\bar{1}$0].

Figure 5A:
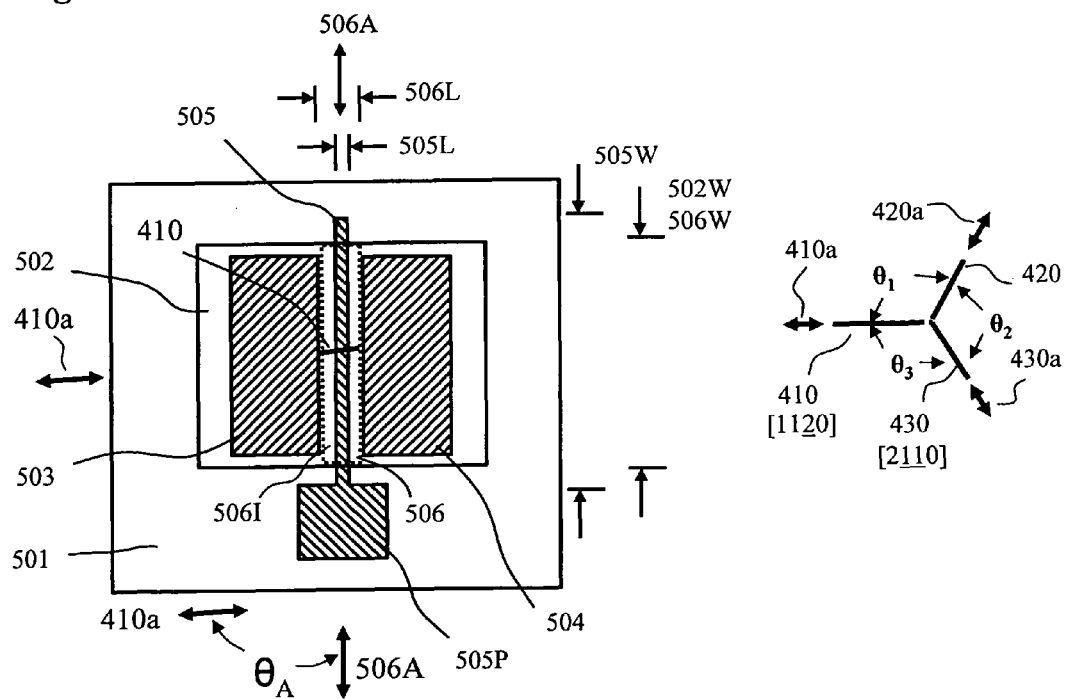
FIG. 5a is a top view of a HEMT (500) with a channel region long axis (506A) aligned to make a first angle $\theta_A$ with respect to a first microcrack long axis (410a) of a first microcrack (410) in order to achieve $\theta_A=90°$ so that the effects of three types of microcracks on the power switching or millimeter wave circuit applications of the HEMT are minimized.

According to one embodiment of the present invention, in order to minimize the possible detrimental effects of the occurrence or presence of a microcrack of one type in the channel region on the device performance, a HEMT (500) as depicted in FIG. 5a for power switching or for millimeter wave circuit applications is provided. HEMT (500) comprises a substrate (501); a composite epitaxial channel layer (502); a source (503) and a drain (504) defining a channel region (506) having a channel region long axis (506A), a channel region width (506W) and a channel region length (506L); a gate (505) having a gate length (505L), a gate width (505W) and a gate pad (505P). Resistance between the drain (504) and the source (503) is regulated by a voltage applied between the gate (505) and the source (503). Channel long axis (506A) of the channel region (506) is aligned so that the channel region long axis (506A) is substantially perpendicular to a first microcrack long axis (410a) of a first microcrack (410) or a first angle $\theta_A$ between the channel long axis and the first microcrack long axis is substantially 90° to minimize the effects of the first microcrack. Once the channel region long axis (506A) is aligned to be substantially perpendicular to the microcrack long axis of the first microcrack (410), long axes of all other microcracks parallel to the first microcrack will form a right angle with the channel region long axis (506A), therefore the effects of all microcracks in the same direction will be minimized.

When the first angle $\theta_A$ is made to be substantially 90°, if a second microcrack (420) exists in the channel region (506), a second angle $\theta_B$ between the second microcrack long axis (420a) and the channel region long axis (506A) as depicted in FIG. 5b will not be significantly different from 30°. This is guaranteed by the nature of the three types of microcracks ($\theta_1=\theta_2=\theta_3=90°$). Similarly, when a third microcrack (430) happens to be present in the channel region (506), a third angle $\theta_C$ between the third microcrack long axis (430a) and the channel region long axis (506A) as depicted in FIG. 5c will not be substantially different from 30 degrees ($\theta_C$). In this manner, according to the present invention, when the channel region long axis (506A) is aligned to the first microcrack long axis (410a) at a 90 degrees angle, the unwanted increase in resistance between the drain (504) and the source (503) due to the presence of any one of the three types of microcracks (410, 420, 430) can be limited to a value below 1.73% of the ideal drain source resistance when there is no microcracks, for a HEMT with a ratio of channel region width (506W) to channel region length (506L) of 100 or greater.

Since the occurrence of the first microcrack (410) in the composite epitaxial layers may be similar to that of the second microcrack (420) and the third microcrack (430), minimizing the unwanted increase in drain to source resistance due to the presence of these three types of microcracks may well be achieved by aligning the channel region long axis (506A) to be substantially perpendicular to a second microcrack long axis (420a) so that the second angle $\theta_B$ between the channel region long axis and the second microcrack long axis is substantially 90 degree. Similarly, the same outcome can also be achieved by aligning the channel region long axis (506A) of the channel region to be substantially perpendicular to the third microcrack long axis (430a) so that the third angle $\theta_C$ between the channel region long axis and the third microcrack long axis is substantially 90 degree.

When aligning the channel region long axis (506A) to make a first angle $\theta_A$ to the first microcrack long axis (410a), it is preferable to achieve a value of $\theta_A=90°$. However, due to the tolerance in the wafers and equipment, there is a deviation $\Delta\theta_A$ so that the actual angle $\theta_A=90°\pm\Delta\theta_A$. In order to minimize any increase in the drain to source resistance due to the presence of microcracks or defects, the deviation $\Delta\theta_A$ should be kept to be less than 5 degrees and more preferably less than 2 degrees. The same should be applied when the channel region long axis (506A) is aligned to the second microcrack long axis (420a) to achieve $\theta_B=90°\pm\Delta\theta_B$ or when it is aligned to the third microcrack long axis (430a) to achieve $\theta_C=90°\pm\Delta\theta_C$: deviations $\Delta\theta_B$ and $\Delta\theta_C$ should be kept to be less than 5 degree or more preferably less than 2 degree.

As a result of thermal stressing during the operation, some microcracks may be generated in the composite epitaxial layers post-fabrication to affect the performance of HEMTs. Since the channel region long axis (506A) is aligned to have a 90° angle with the microcrack long axis (410a) of the microcrack (410) pre-existing in the channel region, when new microcracks occur in the channel region during operation, those having the same direction as that of the pre-existing microcrack (410) will have minimized negative effects on the performance of the HEMT. Similarly, any other newly formed microcracks will be in either one of the directions of the other two types of microcracks (420, 430), therefore they will have minimized negative effects on the performance of the HEMTs.

For high power or high voltage applications, more than one gate lines may be adopted for the HEMTs with the gate lines connected in parallel. In order to simplify the description and explanation, only one single gate line has been adopted in the present description. It is thus understood that the present invention will be valid for HEMT devices having more than one gate line.

The cross sectional view of the HEMT (500) illustrated in FIG. 5a is shown in FIG. 5d to describe the composite epitaxial channel layers (502). The channel layer (502) consists of a buffer layer (502B), a conductive channel layer (502C), a Schottky barrier layer (502S), a source ohmic layer (502OMS) and a drain ohmic layer (502OMD). Materials for the buffer layer (502B) may be AlN—AlGaN multiple layers or GaAs—InGaAs multiple layers, that for the conductive channel layer (502C) may be GaN, InGaN, InGaAs or GaAs. Materials for the Schottky barrier layer (502S) may be AlGaN or AlGaAs whereas that for the source ohmic layer (502OMS) and drain ohmic layer (502OMD) may be heavily doped GaN, InGaN, doped GaAs or InGaAs.

According to another embodiment of this invention, a thin gate dielectric layer (506I) is inserted between the Schottky barrier layer (502S) and the gate (505) as shown in FIG. 5d so that unwanted leakage current between the gate (505) and the source (503) and leakage current between the gate and the drain (504) are minimized. In this manner, the potential barrier height between the gate and the Schottky barrier layer (502S) is increased to reduce the unwanted leakage current. Material of the thin gate dielectric layer (506I) is selected from a group including silicon nitride, silicon oxide, silicon oxide nitride, magnesium oxide, hafnium oxide, aluminum oxide and their mixtures.

According to still another embodiment of the present invention, as shown in FIG. 5e, the gate (505) has a stem portion (505S) with a stem height (505SH) and a stem length (505SL); a head portion (505H) with a head height (505HH) and a head length (505HL) so that unwanted capacitance associated with the gate is reduced and the distance for charge carriers to transit from source to drain is minimized, to facilitate high frequency operation of the HEMT (500). To achieve high operation frequencies, the stem length (505SL) is selected to be less than 1 µm and the stem height is no less than 0.2 µm. Cross-sectional area of the head portion is substantially greater than that of the stem portion to reduce series resistance of the gate. The stem portion has a first stem gate metal (505S1) and a second stem gate metal (505S2). Material for the first stem gate metal is selected from a first group including Ni, Ti, Ta, W, Pt, and their alloys to ensure a rectifying Schottky contact with the epitaxial layers, whereas material for the second stem gate metal is selected from a second group of Ni, Ti, Ta, W, Al, Au, Cu and their alloys for good adhesion. The head portion is made of metals selected from a group including Ti, W, Au, Cu, Al and their alloys. Materials for the drain contact (503) and source contact (504) can be selected from a combination of metals such as Ti, W, Pt, Al, Au, Cu and their alloys as long as the first metal contacting the composite epitaxial layers can make a low contact resistance.

In order to improve thermal stability of the present HEMT, a layer of passivation material such as silicon nitride, silicon oxide, silicon oxide nitride, magnesium oxide, hafnium oxide, aluminum oxide and their mixtures is deposited. As the processing technology of passivation for transistor devices has been well developed and is common knowledge to those skilled in the art, more description will not be given.

According to the present invention, the HEMT device having controlled channel region long axis with respect to the long axis of the first microcracks or that of the second microcracks or that of the third microcracks to minimize unwanted source to drain resistance increase caused by three possible types of microcracks may well be incorporated in a millimeter wave integrated circuits for the amplification and processing of microwave signals and be incorporated into power modules for switching and regulation of high electrical power.

As stated before, the substrate may be made of materials such as silicon, silicon carbide and sapphire as long as their crystalline quality is suitable for epitaxial growth of the III-nitride layers. Whereas the materials for the III-nitride layers may include AlN, GaN, InN, AlGaN, InGaN, AlInN and their alloys, and the materials for III-arsenide layers may include AlAs, GaAs, InAs, AlGaAs and InGaAs.

What is claimed is:

1. A high electron mobility transistor having minimized effects of unwanted microcracks in the channel layers, for power switching and millimeter wave integrated circuit applications comprises
    a substrate;
    a composite epitaxial layer including at least an epitaxial buffer layer, a conductive channel layer, a Schottky barrier layer, a source ohmic layer and a drain ohmic layer;
    a drain and a source defining a channel region having a channel region long axis, a channel region length and a channel region width; and
    a gate having a gate long axis, a gate length and a gate width;
wherein long axes of said unwanted microcracks induced in said composite epitaxial layers during fabrication and operation are parallel to each other, said channel region long axis of said HEMT is aligned in order that an angle θ between said channel region long axis and said long axis of all of said unwanted microcracks is 90°±Δθ so that effects of said unwanted microcracks on a resistance increase between said source and said drain is minimized.

2. A HEMT having minimized effects of unwanted microcracks in the channel layers as defined in claim 1, wherein said Δθ is no more than 10 degrees and more preferably no more than 2 degrees.

3. A HEMT having minimized effects of unwanted microcracks in the channel layers as defined in claim 1, wherein said substrate is selected from a material group including silicon, silicon carbide, gallium arsenide and sapphire.

4. A HEMT having minimized effects of unwanted microcracks in the channel layers as defined in claim 1, wherein said composite epitaxial layers are selected from a combination of materials from a group of AlN, GaN, InN, AlGaN, InGaN, AlInN and their alloys.

5. A HEMT having minimized effects of unwanted microcracks in the channel layers as defined in claim 1, wherein said composite epitaxial layers are selected from a combination of materials from a group of AlAs, GaAs, InAs, AlGaAs, InGaAs, AlInAs and their alloys.

6. A HEMT having minimized effects of unwanted microcracks in the channel layers as defined in claim 1, wherein said drain and source are made of composite metal layers selected from a material group including Ti, Ni, W, Pt, Al, Au, Cu and their alloys so that a contacting metal makes a low resistance ohmic contact to said composite epitaxial layers.

7. A HEMT having minimized effects of unwanted microcracks in the channel layers as defined in claim 1, wherein said gate is made of composite metal layers selected from a metal group of Ni, Ti, Ta, W, Pt, Al, Au, Cu and their alloys so that a contacting metal makes a rectifying Schottky contact to said epitaxial layers in said channel region to effect modulation of channel charge density upon application of a regulating voltage to said gate.

8. A HEMT having minimized effects of unwanted microcracks in the channel layers as defined in claim 1, further comprising a thin gate dielectric layer between said composite epitaxial layers and said gate in order to minimize leakage current between said gate and said source, and leakage current between said gate and said drain, material of said thin gate dielectric layer is selected from a group of silicon nitride, silicon oxide, silicon oxide nitride, magnesium oxide, hafnium oxide, aluminum oxide and their mixtures.

9. A HEMT having minimized effects of unwanted microcracks in the channel layers as defined in claim 1, further comprising a passivation layer to enhance reliability and stability of said HEMT, material of said passivation layer is selected from a group including silicon nitride, silicon oxide, silicon oxide nitride, magnesium oxide, hafnium oxide, aluminum oxide and their mixtures.

10. A HEMT having minimized effects of unwanted microcracks in the channel layers as defined in claim 1, wherein said gate has a gate stem portion with a gate stem portion height and a gate stem portion length and a gate head portion with a gate head portion height and gate head portion length, said gate stem portion length is selected to be less than 1 µm and more preferably less than 0.3 µm, cross-section of said head portion is substantially greater than cross-section of said stem portion to facilitate high frequency operation.

11. A high electron mobility transistor having minimized effects of three types of unwanted microcracks in the channel layers, for power switching and millimeter wave integrated circuit applications comprises
    a substrate;
    a composite epitaxial layers including at least an epitaxial buffer layer, a conductive channel layer, a Schottky barrier layer, a source ohmic layer and a drain ohmic layer;

a drain, a source defining a channel region having a channel region long axis, a channel region length and a channel region width;

a gate having a gate long axis, a gate length and a gate width;

wherein said three types of unwanted microcracks are induced in said composite epitaxial layers during fabrication and operation, said channel region long axis of said HEMT is aligned to make a first angle $\theta_A$ with a first microcrack long axis, a second angle $\theta_B$ with a second microcrack long axis and a third angle $\theta_C$ with a third microcrack long axis, effects of said three types of unwanted microcracks on a resistance increase between said source and said drain is minimized by selecting one of said three angles to be $90°\pm\Delta\theta$.

12. A HEMT having minimized effects of three types of unwanted microcracks in the channel layers as defined in claim 11, wherein said first angle $\theta_A$ between said channel region long axis and said first microcrack long axis is selected to be 90 degrees and deviation $\Delta\theta$ is no more than 5 degrees or more preferably no more than 2 degrees.

13. A HEMT having minimized effects of three types of unwanted microcracks in the channel layers as defined in claim 11, wherein said second angle $\theta_B$ between said channel region long axis and said second microcrack long axis is selected to be 90 degrees and deviation $\Delta\theta$ is no more than 5 degrees or more preferably no more than 2 degrees.

14. A HEMT having minimized effects of three types of unwanted microcracks in the channel layers as defined in claim 11, wherein said third angle $\theta_C$ between said channel region long axis and said third microcrack long axis is selected to be 90 degrees and deviation $\Delta\theta$ is no more than 5 degrees or more preferably no more than 2 degree.

15. A HEMT having minimized effects of three types of unwanted microcracks in the channel layers as defined in claim 11, wherein said substrate is selected from a material group of silicon, silicon carbide, gallium arsenide and sapphire.

16. A HEMT having minimized effects of three types of unwanted microcracks in the channel layers as defined in claim 11, wherein said composite epitaxial layers are from a combination of materials from a group of AlN, GaN, InN, AlGaN, InGaN, AlInN and their alloys.

17. A HEMT having minimized effects of three types of unwanted microcracks in the channel layers as defined in claim 11, wherein said composite epitaxial layers are from a combination of materials from a group of AlAs, GaAs, InAs, AlGaAs, InGaAs, AlInAs and their alloys.

18. A HEMT having minimized effects of three types of unwanted microcracks in the channel layers as defined in claim 11, wherein said drain and source are made of composite metal layers selected from a material group including Ti, Ni, W, Pt, Al, Au, Cu and their alloys so that a contacting metal makes a low resistance ohmic contact to said composite epitaxial layers.

19. A HEMT having minimized effects of three types of unwanted microcracks in the channel layers as defined in claim 11, wherein said gate is made of composite metal layers selected from a metal group of Ni, Ti, Ta, W, Pt, Al, Au, Cu and their alloys so that a contacting metal makes a rectifying Schottky contact to said epitaxial layers in said channel region to effect modulation of channel charge density upon application of a regulating voltage to said gate.

20. A HEMT having minimized effects of three types of unwanted microcracks in the channel layers as defined in claim 11, further comprising a passivation layer to enhance reliability and stability of said HEMT, material of said passivation layer is selected from a group including silicon nitride, silicon oxide, silicon oxide nitride, magnesium oxide, hafnium oxide, aluminum oxide and their mixtures.

21. A HEMT having minimized effects of three types of unwanted microcracks in the channel layers as defined in claim 11, further comprising a thin gate dielectric layer between said composite epitaxial layers and said gate in order to minimize leakage current between said gate and said source, and leakage current between said gate and said drain.

22. A HEMT having minimized effects of three types of unwanted microcracks in the channel layers as defined in claim 11, wherein said gate has a gate stem portion with a gate stem portion height and a gate stem portion length and a gate head portion with a gate head portion height and gate head portion length, said gate stem portion length is selected to be less than 1 µm and more preferably less than 0.3 µm, cross-section of said head portion is substantially greater than cross-section of said stem portion to facilitate high frequency operation.

* * * * *